United States Patent [19]

Flaker

[11] 4,404,635
[45] Sep. 13, 1983

[54] PROGRAMMABLE INTEGRATED CIRCUIT AND METHOD OF TESTING THE CIRCUIT BEFORE IT IS PROGRAMMED

[75] Inventor: Roy C. Flaker, Essex Junction, Vt.

[73] Assignee: International Business Machines Corporation, Armonk, N.Y.

[21] Appl. No.: 248,646

[22] Filed: Mar. 27, 1981

[51] Int. Cl.³ .................... G01R 31/26; G01R 15/12
[52] U.S. Cl. ................................ 364/481; 324/158 R; 324/73 R; 364/580
[58] Field of Search ............ 324/73 R, 73 AT, 158 R; 364/481, 488, 489, 490, 579, 580, 482; 371/15

[56] References Cited

U.S. PATENT DOCUMENTS

| | | | |
|---|---|---|---|
| 3,772,595 | 11/1973 | Wolf et al. | 324/73 R |
| 3,787,810 | 1/1974 | Wiggins et al. | 324/73 R X |
| 3,789,205 | 1/1974 | James | 324/73 R X |
| 3,801,910 | 4/1974 | Quinn | 324/158 D |
| 3,815,025 | 6/1974 | Jordan | 324/73 R |
| 3,956,698 | 5/1976 | Malmberg et al. | 324/158 R |
| 3,958,110 | 5/1976 | Hong et al. | 371/15 |
| 4,053,833 | 10/1977 | Malmberg et al. | 324/158 R |
| 4,140,967 | 2/1920 | Balasubramanian et al. | 324/73 R |
| 4,233,671 | 11/1980 | Gerzberg et al. | 365/105 |

OTHER PUBLICATIONS

IBM TDB, vol. 17, #1, Jun. 1974, pp. 245-247, "Memory System Fabrication Using Laser Formed Connections".

IBM TDB, vol. 18, #4, Sep. 1975, pp. 1047-1048, "Programmed Power Proportioning for PLA's".

*Primary Examiner*—Edward J. Wise
*Attorney, Agent, or Firm*—Francis J. Thornton

[57] ABSTRACT

This teaches a method of testing normally untestable, programmable integrated circuits before they are irreversibly programmed by providing the circuit with first and second impedances which combine to form an initial resultant impedance. The second of these impedances has a significantly higher level of impedance then does the first. The first of these impedances is required for testing purposes only and must be subsequently effectively removed from the circuit once testing of the circuit is completed. Once the circuit has been tested the second or higher impedance is made to interact with the circuit and functionally eliminate the first impedance from the circuit. The resultant impedance of the circuit after the first impedance has been functionally removed from the circuit can be either higher or lower than the pre-programmed initial resultant impedance of the circuit.

8 Claims, 3 Drawing Figures

PROGRAMMABLE INTEGRATED CIRCUIT AND METHOD OF TESTING THE CIRCUIT BEFORE IT IS PROGRAMMED

This invention relates generally to semiconductor device circuits and more particularly to a method for testing irreversible, programmable integrated circuits before they are irreversibly programmed.

BACKGROUND OF THE INVENTION

IBM Technical Disclosure Bulletin, Vol. 17, #1, June 1974, pp. 245-247, describes a memory system fabrication scheme using a laser to form connections in which the connections are formed through an overlying oxide layer without removal of a portion of the oxide layer so that metal lines on the surface of the oxide are connected to underlying, diffused signal tracks.

U.S. Pat. No. 3,801,910 issued Apr. 2, 1974 to H. F. Quinn and assigned to the same assignee as is the present invention, discloses a method of using a photodiode to temporarily interconnect a selected circuit to a test point. Specifically, this patent teaches that by shining a light on a photodiode it can be made to conduct and temporarily cause a circuit to be connected to a test bus.

U.S. Pat. No. 4,140,967 issued Feb. 20, 1979 to B. S. Balasubramanian et al and assigned to the same assignee as the present invention, discloses a programmable logic array and a method of testing it after it is programmed.

U.S. Pat. No. 4,233,671 issued Nov. 11, 1980 to L. Gerzberg et al, discloses read-only memory and integrated circuits and a method of programming them by laser means.

U.S. Pat. No. 3,956,698 issued May 11, 1976 to P. R. Malmberg et al and its continuation-in-part U.S. Pat. No. 4,053,833 issued Oct. 11, 1977, discloses a method for testing an integrated circuit by switching on a diode. Thus, these patents are similar to the teaching of U.S. Pat. No. 3,801,910. Subsequently, Malmberg short circuits the diode by a selected metallization step with standard vapor or sputter deposition techniques.

IBM Technical Disclosure Bulletin, Vol. 18, #4, September 1975, pp. 1047-1048, teach a program power proportioning scheme for programmable logic arrays.

In programmable logic arrays circuits such as latches or decoder circuits are partially or totally inoperable prior to the programming of the array and thus normally untestable until after the array has been programmed.

The present invention overcomes this problem and permits the testing of such circuits prior to the programming of the associated logic array.

SUMMARY OF THE INVENTION

It is thus an object of the present invention to provide a means for testing such normally untestable circuits prior to programming of the array with which they are associated.

It is a further object of the invention to provide a means whereby the testing means is functionally eliminated by using the same means that is used to program the array.

It is another object of the present invention to provide means whereby the programming of the circuit also results in tailoring of the final impedance characteristics of the circuit.

It is still another object of the invention to provide a circuit which can be programmed to have either increased or decreased impedance characteristics.

The present invention thus comprises a method of testing such normally untestable circuits by providing the circuit to be tested with first and second impedances which combine to form an initial resultant impedance. The second of these impedances has a significantly higher level of impedance than does the first. Once the circuit has been tested the second or higher impedance is made to interact with the circuit, and functionally eliminate the first impedance from the circuit. This altered resultant impedance can be higher or lower than the initial resultant impedance.

In one embodiment the method is used to test latch inputs to a decoder circuit.

In another embodiment the decoder circuit itself can be altered to provide power proportioning or can be altered so as to form a two to four decoder from a single bit position decoder.

The invention and objects and features thereof will be readily understood from the following detailed description when taken with the accompanying drawings herein:

DESCRIPTION OF THE PREFERRED EMBODIMENT

Figure 1:
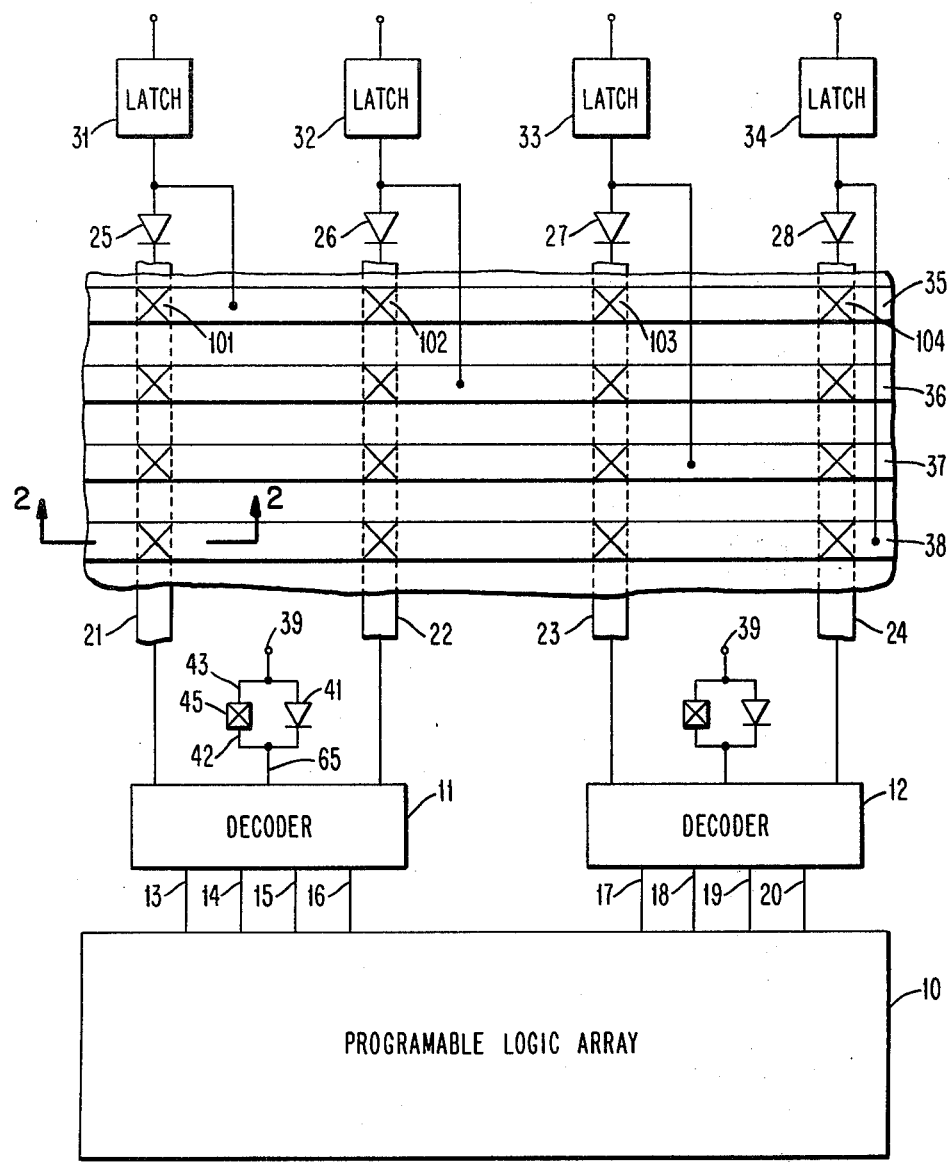
FIG. 1 is a block diagram showing the arrangement necessary to pretest the latch and decoder inputs to a programmable logic array prior to programming of the array in accordance with the present invention when built in an integrated circuit form.
Figure 2:
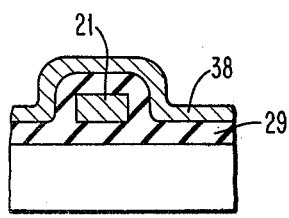
FIG. 2 is a section of two of the crossed metal lines of FIG. 1.
Figure 3:
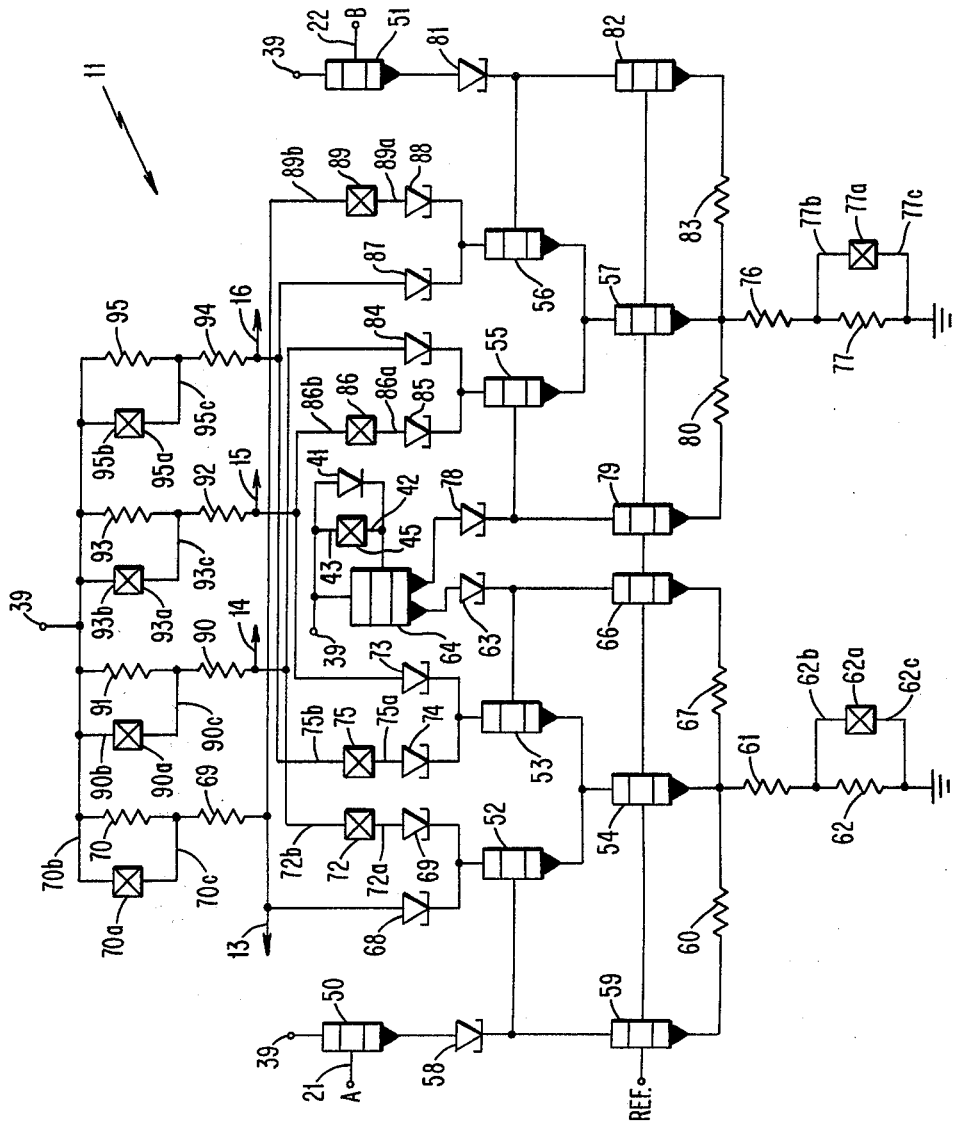
FIG. 3 is a schematic drawing of the decoder of FIG. 1 further illustrating the present invention.

Reference should be simultaneously made to FIGS. 1, 2 and 3. FIG. 1 shows a block diagram of the latch and decoder inputs coupled to a programmable logic array prior to programming of the array.

FIG. 2 is a section of two of the crossed metal lines of FIG. 1.

FIG. 3 is a schematic drawing of the decoder of FIG. 1 further illustrating the present invention.

Shown in the figure is a programmable logic array 10 with two decoder circuits 11 and 12 coupled thereto via decoder output lines 13, 14, 15, 16, 17, 18, 19 and 20. Such decoder circuits are also known as 2 bit partitioner circuits. Each decoder is coupled in turn to a pair of input metal lines. Thus, decoder 11 is coupled to input metal lines 21 and 22 while decoder 12 is coupled to input metal lines 23 and 24. Each of these input metal lines is in turn coupled through a respective diode to a respective latch circuit. Thus, line 21 is connected via diode 25 to latch 31. The line 22 is connected via diode 26 to latch 32, line 23 is coupled via diode 27 to latch 33 and line 24 is connected via diode 28 to latch 34.

Additional electrically floating metal lines 35, 36, 37 and 38 are deposited over but isolated from the metal lines 21, 22, 23 and 24 by an isolating layer 29. It should also be noted that these floating metal lines 35 through 38 are arranged orthogonal to the underlying metal lines 21 through 24. These floating metallic lines are provided between the latch circuits and the decoder circuits. Thus, there is one such orthogonal line there for each latch circuit and each is wired to a respective latch circuit. Thus, line 21 is connected to latch circuit 31 via diode 25 and the floating line 35 is coupled to the latch circuit 31 via a direct wire connection. Similarly, line 22 is connected to the latch circuit 32 via the diode 26 while the floating line 36 is directly connected to the latch circuit 32. Line 23 is connected via the diode 27 to the latch circuit 33 while the floating line 37 is directly connected to the latch circuit 33. Finally, line 24 is connected to the latch circuit 34 via the diode 28 and the floating line 38 is directly connected to this latch circuit 34.

Each decoder circuit is in turn coupled to a voltage source 39. As will be further described below the base of the decoder reference transistor 64 of decoder 11 as shown in FIG. 3 is connected to source 39 via a diode 41. This base of transistor 64 is also connected to a metal line 42 overlying but isolated from a second metal line 43 connected to the source 39. For purposes of description the overlap of any such two metallic lines, such as lines 42 and 43 lying between the decoder and the source 39, will be designated by a box such as box 45 and referred to as a potential connection point.

The reference transistor of the decoder 12 is similarly connected to source 39. However, the elements other than source 39 are not numbered since the detailed description of the interaction of but one decoder, i.e. decoder 11 given below with its respective latches 31 and 32 should suffice to clearly teach the present invention.

The addition of the diodes 25 and 26 to the lines leading from the latch to the decoder and the addition of the diode 41 between the base of the reference transistor 64 and the voltage source 39 of the decoder 11 permits balanced pre-programmed product terms to be applied to the decoder 11 so as to permit testing of the decoder 11 as well as the latches 31 and 32. Similarly, the diodes 27 and 28 together with the diode connected between the base of the reference transistor in the decoder 12 and the source 39 permits testing of the decoder 12 and latches 33 and 34. Patterns generated by standard so-called stuck fault testing methods can be used to test the input latches and the decoder prior to the programming of the array 10. The utilization and introduction of such patterns into latches and decoders is well known to the art and need not be described herein.

Latch 31 supplies a pulse, via diode 25 and line 21, to the base of transistor 50 of FIG. 3 which shows the decoder 11 in schematic detail. It will be assumed, for purposes of illustration only, that the latch 32 is off and not supplying a pulse through diode 26 to the line 22 which is connected to the base of transistor 51. In this instance the current flow through transistor 50 increases while the current flow through the transistor 51 whose base is connected to line 22 remains low. The imposition of one or both of these pulses via latches 31 and 32 to the bases of the respective transistors 50 and 51 causes the output lines 13, 14, 15 and 16 to rise or to remain at their respective level accordingly.

During personalization of the chip each latch is permanently connected to a decoder input, i.e. one of the latches 31, 32, 33 or 34 by fusing together one of the lines 35, 36, 37 or 38 to one of the other underlying lines 21, 22, 23 or 24. For example, latch 31 can be connected to any one of the lines by fusing the electrically floating line 35 at any one of the points 101, 102, 103, or 104. In this case it will be assumed that point 101 was selected, and the line 35 fused to the underlying line 21 and the input of the latch 31 would be supplied to the decoder 11.

When such a fusion occurs the latch thus becomes directly connected to the line to which it has been fused and the diode 25 is effectively isolated since insufficient current will be sent to the diode and the diode 25 will not turn on.

In any event, prior to personalization, each latch can send directly via the diode connecting it to the decoder a signal suitable for testing of the decoder. Because of this diode coupling to the line before personalization, diode 41 is added between the voltage source 39 and the decoder 11 in order to match the drop of the diode 25 between the latch and the line during this pre-programming testing step. Once the array has been programmed and the correct floating line is welded by the laser or fused to the correct underlying line the diode, i.e. diode 25 becomes ineffective and functionally out of the circuit and it becomes necessary to also functionally remove the diode 41 from the circuit. This is accomplished by fusing the lines 42 and 43 together at the indicated point 45. When the lines 42 and 43 become so fused the diode 41 is also functionally removed from the decoder circuit and is of no effect.

The basic concept of the decoder circuit shown in FIG. 3 is well known and is basically a pair of emitter coupled switches. This decoder can be used either as a single bit position decoder or alternately as a two to four bit decoder and can be supplied with power proportioning.

Of the two emitter coupled logic switches one switch is comprised of switching transistors 52 and 53 and a common current transistor 54 while the second comprised of switching transistors 55 and 56 with a common current transistor 57. The transistor 52 has its base coupled through a diode 58 to the emitter of the input transistor 50 whose collector is coupled to source 39. The base of transistor 52 is also coupled through a current transistor 59 whose base is connected to a reference voltage REF. and to base of transistor 54. The emitter of transistor 59 is coupled through a resistor 60 to the emitter of the current transistor 54 and through a pair of resistors 61 and 62 to ground. The base of transistor 53 is coupled through a diode 63 to the emitter of a reference transistor 64 whose collector is coupled in common with the collector of transistor 50, and whose base is coupled to the source 31 via diode 41 and lines 42 and 43 via connection point 45. The base of transistor 53 is also coupled through a current transistor 66 whose base is in common with the bases of transistors 54 and 59 and whose emitter is coupled through a resistor 67 to the emitter of transistor 54.

The collector of transistor 52 is coupled to the output line 13 through a diode 68. Line 13 is coupled through series resistors 69 and 70 to source 39. The collector of transistor 52 is also coupled via a diode 71 and via a potential connection point 72 to the line 14. This connection point 72 is formed by the line 72a and an overlying insulated line 72b. The lines 72a and 72b need only to be isolated, one from the other, by an insulation material where they overlap at point 72. The line 72b is also coupled directly to the output 14. The transistor 53 is similarly connected, i.e. it is directly coupled to the line 15 through diode 73 and through a diode 74 and a potential connection point formed of isolated lines 75a and 75b to the line 16.

Transistors 55 and 56 are also common emitters coupled through a current transistor 57 whose emitter is coupled to ground through series resistors 76 and 77. The base of transistor 55 is coupled to the emitter of the transistor 64 through a diode 78 and to the collector of a current transistor 79 whose base is tied in common with transistors 53, 55, 78, 87 and 90. The emitter of transistor 79 is coupled through a resistor 80 to the emitter of transistor 57. The base of transistor 56 is coupled to the emitter of an input transistor 51 through a diode 81 and to the collector of a current transistor 82 whose emitter is coupled through a resistor 83 to the emitter of current transistor 57. The base of transistor 51 is of course coupled to line 22.

The transistor 55 is connected to the line 14 through a diode 84 and the collector coupled via diode 85 and connection point 86 formed of lines 86a and 86b to the line 15. Again these lines are isolated one from the other at the point 86. Similarly, the transistor 56 has its collector coupled via diode 87 to line 16 and via diode 88 and potential connection point 89 formed of isolated lines 89a and 89b.

Line 14 is connected to source 39 via series resistors 90 and 91, line 15 via series resistors 92 and 93 and line 16 via series resistors 94 and 95. At least one resistor in each of these series is provided with a parallel potential connection point.

The pairs of lines 72a, 72b, 75a, 75b, 86a, 86b and 89a and 89b forming the respective potential connection points 72, 75, 86 and 89 remain isolated one from the other by virtue of the isolation material between the lines.

The circuit as shown is a single bit decoder and the output is accomplished with the respective current switches which direct the drive current into selected ones of the respective output lines 13 or 15 and 14 or 16. A selected output is one which has no current flowing therein. Consequently one line will be more positive than the other in each pair. The voltage levels with respect to ground of the input lines 21 and 22 determine which of the current sources will be conducting as is well known in the art. Thus, for example resistor 70 has a parallel connection point 70a which is formed by the overlying of isolated lines 70b and 70c. Similarly, resistor 90 has a parallel connection point 90a which is formed by overlying isolated lines 90a, 90b and 90c. Again resistor 93 and 94 have similar connection points in parallel therewith, i.e. resistor 93 has a connection point 93a formed by lines 93b and 93c, while resistor 95 has a parallel connection point 95a formed by lines 95b and 95c. This is also true of resistors 62 and 77 which also have parallel connection points. Thus, resistor 62 has a parallel connection point 62a formed of lines 62b and 62c. While resistor 77 has a parallel connection point 77a formed by lines 77b and 77c. In each of these cases if a device is treated such that a conducting juncture is formed between the lines at the connection point the respective resistor would be effectively removed from the circuit since the joined lines would have a lower impedance then that of the resistor. Thus, for example if the junction point 70a were treated such as to remove the isolation between the lines 70b and 70c an effective short circuit would be formed around the resistor 70 and the resistor 70 would be removed from the circuit. The operation of such decoders is well known in the art.

Now in the case where a two to four bit decoder is desired it is necessary that the connection points between the collector of the respective emitter coupled transistors and the output lines be treated so that whenever one of the emitter coupled transistors turns on both lines coupled to its collector will be selected. Thus, for example if connection point 72 was treated so that lines 72a and 72b are directly connected then when transistor 52 turns on both line 13 and line 14 would be selected. By selectively treating the connection points 72, 75, 86 and 89 to join the respective, necessary lines the unit can be made into a two to four bit decoder so that each of the respective emitter coupled transistors forming the two emitter coupled switches, i.e. transistors 52, 53, 55 and 56, will, when activated, select one of the output lines 13, 14, 15, 16.

By providing connection points 70a and 90a, 93a, 95a around each of respective ones of the series transistors coupled to the output lines power proportioning can be achieved so that the drive power levels to each of the array lines to each of the output lines 13, 14, 15 and 16 can be made proportional to the loading of that individual line. The programming or treatment of all such interconnection points would of course be made at the same time. Program power proportioning of programmable logic arrays is generally described in Vol. 18, #4, September 1975 in the IBM Technical Disclosure Bulletin, on page 1048. Thus, by selectively forming selected ones of these interconnection points as described both the programmable logic array and the decoder circuits can be tailored to achieve selective impedance characteristics in the circuit. Additionally, by providing such potential connection points, especially between the individual floating lines as described in the array, latch inputs can be provided to the decoder prior to the actual programming of the logic array unit. Since it provides initial impedance line to the input of their decoder which impedance can be later effectively removed so that the actual unit can be programmed to a desired end result. For example, if we consider the latch 31 which is coupled to line 21 through diode 25. The input of the latch can be provided to line 21 while the output of the latch 32 which is connected to line 22 can also be provided to the decoder 11 and to test the output of the decoder at lines 13, 14, 15 and 16. Additionally, by using various combinations of series and parallel resistors together with either serial or parallel connection points even greater latitude can be achieved in tailoring impedances in a circuit. Of course the technique can be used with other circuit elements both active and passive.

One can easily tailor the impedance of any line by selection of circuit elements. For example if we consider a simple circuit comprised of a diode in parallel with a series combination of a resistor and a connection point then by either selecting the current through the circuit or by controlling the value of the resistor, the final resultant impedance of the circuit, after fusion of the connection point can be either higher or lower than that of the diode alone.

EXAMPLE 1

A diode is in parallel with a 500 ohm resistor in series with a connection point. If we assume that the current flow through the circuit is 0.1 amps then before the connection point is fused all the current is flowing through the diode and the circuit has an apparent impedance of 260 ohms. After fusion of the connection point the diode effectively drops out of the circuit and the impedance of the circuit is that of the resistor, i.e. 500 ohms. Thus, the resultant impedance of the circuit increases over that of the diode alone.

EXAMPLE 2

The circuit of example 1 is again assumed. In this case however, only 0.01 amps is assumed to be flowing through the circuit. At this current level, the impedance of the diode appears to be 2600 ohms.

When the connection point is fused the diode effectively drops out of the circuit and the impedance of the circuit is 500 ohms, the value of the resistor. Thus, the resultant impedance of the circuit is lowered below that of the diode alone.

EXAMPLE 3

The diode, resistor and connection point combination set above is again assumed. In this case however, it will be assumed that the resistor has a value of 100 ohms and the current drawn through the circuit is 0.1 amps. Before fusion of the connection point the diode, at this current flow, appears to have an impedance of 260 ohms. After fusion the connection point the diode effectively drops out of the circuit and the resultant impedance of the circuit is that of the resistor, i.e. 100 ohms. Thus, the resultant impedances of the circuit is lowered below that of the diode alone.

Such tailoring of the circuit of FIG. 1 could be accomplished for example by forming resistors in parallel with each of the diodes 25, 26, 27, and 28 or for example by forming the floating lines 35, 36, 37 and 38 of doped polysilicon so as to have a tailored resistance per unit length of line.

In actual use it has been found that a so-called nitrogen dye laser having a pulse width of 4 to 8 nanoseconds, a repetition rate of 50 hertz, a spot diameter of 5 microns and a power density of $10^8$ watts/cm$^2$ can be advantageously used to fuse connection points formed of overlying aluminum lines about 1 micron to 1.2 microns thick with a layer of silicon dioxide 2 microns thick therebetween. Each connection point should be about 14 microns square.

While the invention has been particularly described with reference to the preferred embodiments thereof it will be understood by those skilled in the art that the foregoing and other changes in form and details be made therein without departing from the spirit and scope of the invention.

What is claimed is:

1. A method of testing a programmable circuit prior to programming comprising;
   providing a first element, having a selected impedance, integral with the circuit,
   providing a second element, having a selected impedance, integral with the circuit,
   said second element being in parallel with said first element,
   said second element having an impedance substantially higher than the impedance of the first element,
   measuring the electrical characteristics of the circuit by applying selected voltages to said circuit, and
   reducing the impedance of said second element to a value substantially below the impedance value of the first element it is in parallel with to alter the total impedance of the circuit.

2. The method of claim 1 wherein the reducing of the impedance of said second element reduces the total impedance of the circuit.

3. The method of claim 1 wherein the reducing the impedance of said second element increases the total impedance of the circuit.

4. The method of claim 1 wherein said first element has first and second terminals, and said second element is comprised of first and second overlying metal lines insulated from each other by an insulating layer lying therebetween.

5. The method of claim 4 wherein said reducing step consists of directing a laser beam of sufficient intensity against said overlying metal lines for a period of time sufficient to melt said metal lines, rupture said insulating layer and fuse said lines.

6. The method of claim 4 wherein said first metal line of said second element is coupled to the first terminal of said first element and said second metal line is coupled to said second terminal.

7. A method of testing a programmable circuit prior to programming comprising;
   providing a first set of elements, each of said elements having a selected impedance, integral with the circuit,
   providing a second set of elements, each of said elements having a selected impedance, integral with the circuit,
   each element of the second set being in series with at least one of said elements of said first set,
   each element of the second set having an impedance higher than the impedance of the elements of the first set,
   measuring the electrical characteristics of the circuit by applying selected voltages to said circuit, and
   reducing the impedance of selected ones of said elements in said second set to a value substantially below the impedance value of the element of said first set it is in series with to alter the total impedance of the circuit.

8. A method of testing a programmable circuit prior to programming comprising;
   providing a first set of elements, each of said elements having a selected impedance, integral with the circuit,
   providing a second set of elements, each of said elements having a selected impedance, integral with the circuit,
   each element of the second set being in series with at least one of said elements of said first set,
   each element of the second set having an impedance higher than the impedance of the elements of the first set,
   measuring the electrical characteristics of the circuit by applying selected voltages to said circuit, and
   reducing the impedance of selected ones of said elements in said second set to a value substantially below the impedance value of the element of said first set it is in parallel with to alter the total impedance of the circuit.

* * * * *